United States Patent [19]

Takebuchi

[11] Patent Number: 5,321,352
[45] Date of Patent: Jun. 14, 1994

[54] PROBE APPARATUS AND METHOD OF ALIGNMENT FOR THE SAME

[75] Inventor: Ryuichi Takebuchi, Yamanashi, Japan

[73] Assignee: Tokyo Electron Yamanashi Limited, Nirasaki, Japan

[21] Appl. No.: 922,791

[22] Filed: Jul. 31, 1992

[30] Foreign Application Priority Data

Aug. 1, 1991 [JP] Japan .................................. 3-216069

[51] Int. Cl.$^5$ .......................................... G01R 1/067
[52] U.S. Cl. ............................. 324/158 F; 324/73.1; 324/158 P; 324/690
[58] Field of Search ............... 358/101, 106; 324/458, 324/158 R, 158 F, 158 P, 537

[56] References Cited

U.S. PATENT DOCUMENTS

| | | |
|---|---|---|
| 4,103,232 | 7/1978 | Sugita et al. . |
| 4,565,966 | 1/1986 | Burr et al. ................................ 324/73 |
| 4,775,281 | 10/1988 | Prentakis . |
| 4,929,893 | 5/1990 | Sato et al. . |
| 5,023,557 | 6/1991 | Moran et al. ........................ 324/537 |
| 5,065,103 | 11/1991 | Slinkman et al. ............... 324/158 R |

FOREIGN PATENT DOCUMENTS

| | | |
|---|---|---|
| 63-60542 | 3/1988 | Japan . |
| 64-50434 | 2/1989 | Japan . |
| 194631 | 4/1989 | Japan . |
| 1119036 | 5/1989 | Japan . |

Primary Examiner—Ken Wieder
Assistant Examiner—Barry C. Bowser
Attorney, Agent, or Firm—Oblon, Spivak, McClelland, Maier & Neustadt

[57] ABSTRACT

A probe apparatus for measuring electrical characteristics of chips arranged on a wafer comprises a probe card having probe needles and a rotary chuck for supporting the wafer. The chuck is supported on an XY stage. A stationary alignment bridge is provided with a stationary camera and a capacitance sensor. The stage is provided with a movable camera. A transparent plate on which a target is formed is attached to the chuck. The target and its peripheral portion are formed of transparent thin films. The target is used for positioning and focusing of the cameras. The thin films are used for height detection by use of the capacitance sensor.

25 Claims, 8 Drawing Sheets

PROBE APPARATUS AND METHOD OF ALIGNMENT FOR THE SAME

BACKGROUND OF THE INVENTION

1. Field of the Invention

The present invention relates to a probe apparatus for use in examining an object such as a semiconductor wafer, and a method of alignment for the probe apparatus.

2. Description of the Related Art

A number of chips are formed on a surface of an object such as a semiconductor wafer. The chips are regularly arranged at predetermined intervals. A number of pads are formed at predetermined locations on each chip. The pads are connected to various semiconductor elements provided within the chip. The electric characteristics of the chip are examined with probe needles of an examining apparatus put in contact with the corresponding pads within the chip. A defective chip is discriminated by marking or other means. Normally, a probe apparatus is used for this kind of examination for the purpose of automation.

The newest type of the probe apparatus has a vertically movable chuck for holding a semiconductor wafer or an object to be examined. The chuck is supported on a stage and is movable in a horizontal plane.

A stationary camera is provided on the alignment bridge of the probe apparatus. The stationary camera is used to detect the position of a given chip on the surface of the semiconductor wafer held by the chuck. On the other hand, a movable camera is provided on the stage so as to be vertically movable. The movable camera is used to detect the position of the probe needle put in contact with a predetermined location on the chip.

According to the above conventional apparatus, alignment between the chip and probe needles is performed, on the premise that the positional relationship (i.e. distance) between the chip to be detected by the stationary camera and the movable camera for detecting the probe needles is constant. However, when examination is performed at high temperatures or low temperatures, the positional relationship slightly varies owing to thermal expansion or contraction of the semiconductor wafer or chuck, or a variation in the position of the wafer on the chuck. Consequently, in the above conventional apparatus, precision of the alignment lowers owing to the variation in the positional relationship.

SUMMARY OF THE INVENTION

According to the present invention, there is provided a probe apparatus for measuring electrical characteristics of each of a plurality of chips arranged on a substrate to be examined, said probe apparatus comprising:

a probe card having a plurality of probe needles for contact with one of the chips on the substrate;

signal exchange means for exchanging electric signals between said signal exchange means and one of the chips via said probe needles;

a chuck, situated to face the probe card, for supporting the substrate, said chuck being rotatable in a horizontal plane;

a stage for supporting the chuck, said stage being movable horizontally first detection means for optically detecting the horizontal position of the chip;

second detection means for optically detecting the horizontal position and height of the probe needles;

a capacitance sensor for detecting the height of the chip;

a transparent plate attached to the chuck and situated between the first and second detection means;

a target formed on the target, the center of the target being employed for horizontal positioning and focusing of the first and second detection means and serving as a reference point for calculating a horizontal distance between the chip and the probe needles;

an electrically conductive and transparent first thin film formed on the transparent plate, a major surface of the first thin film, which surface is on the capacitance sensor side, serving as a reference point for calculating a vertical distance between the chip and the probe needles; and a processor for controlling the operations of the first and second detection means, the capacitance sensor, the chuck and the stage, and for calculating a distance between the chip and the probe needles on the basis of data supplied from the first and second detection means, the capacitance sensor, the chuck and the stage.

By using the probe apparatus of the present invention, it is possible to correct a variation in the positional relationship due to thermal expansion or contraction of the wafer or chuck when examination is performed at high temperatures or at low temperatures, or a variation in the position of the wafer on the chuck.

With the probe apparatus of the present invention, alignment is effected not only in a horizontal direction but also in a vertical direction, and therefore contact pressure acting between the pads within the chip and probe needle tips can be made uniform. In addition, since a vertical profile (i.e. height profile) of the surface of the object to be examined is detected, the height of the chuck elevated when the probe needles are brought into contact with the chips can be adjusted. Accordingly, even if the wafer has a non-uniform thickness or a warp, the contact pressure acting between the chips and the probe needle tips can be made uniform. Furthermore, since a target and its peripheral portion is made of an electric conductor, their height can be detected by a capacitance sensor. Accordingly, the time required for alignment between the probe needles and the chips can be decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Figure 1:
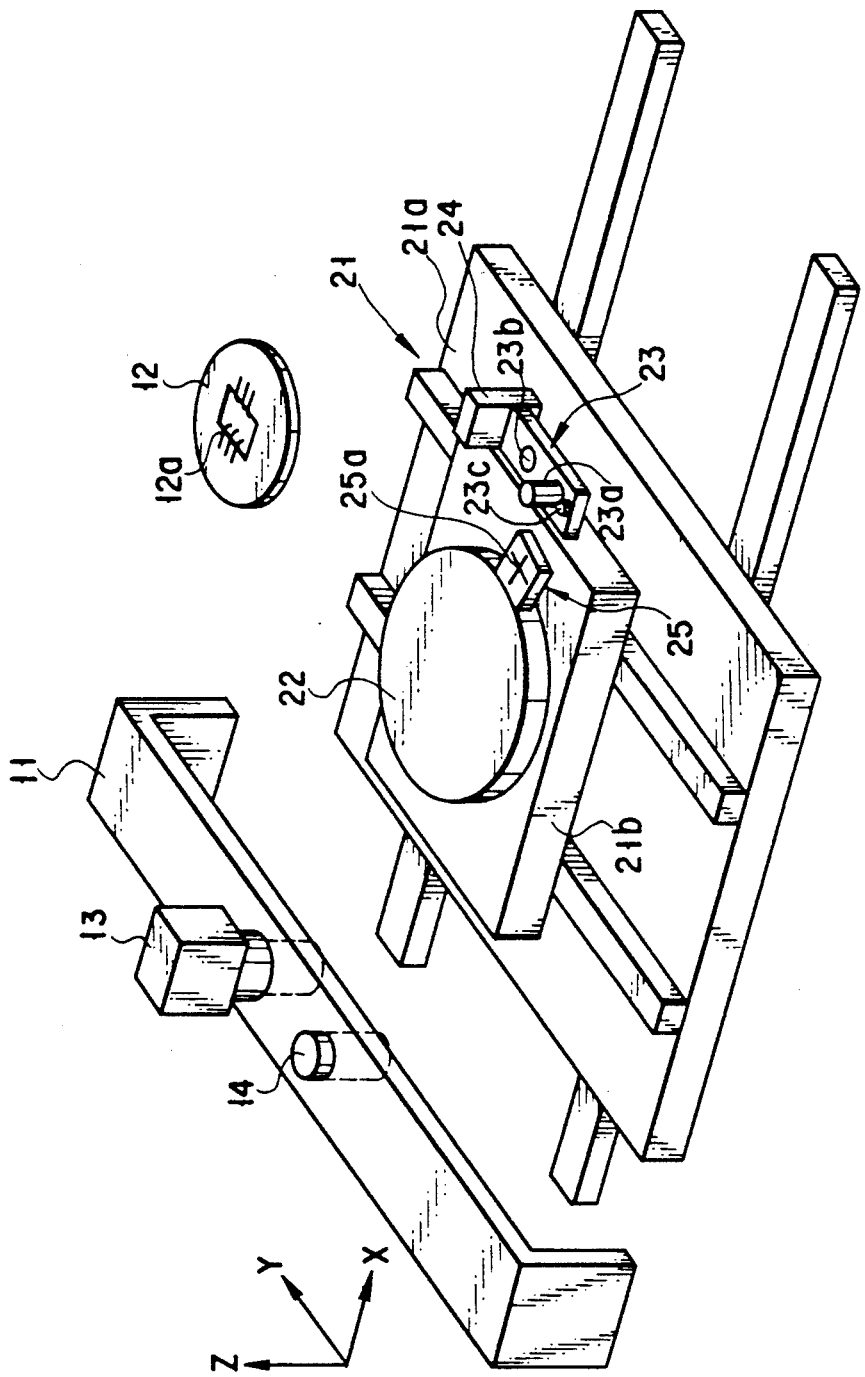
FIG. 1 is a perspective view showing a main structure of a probe apparatus for semiconductor wafers according to an embodiment of the present invention.
Figure 2:
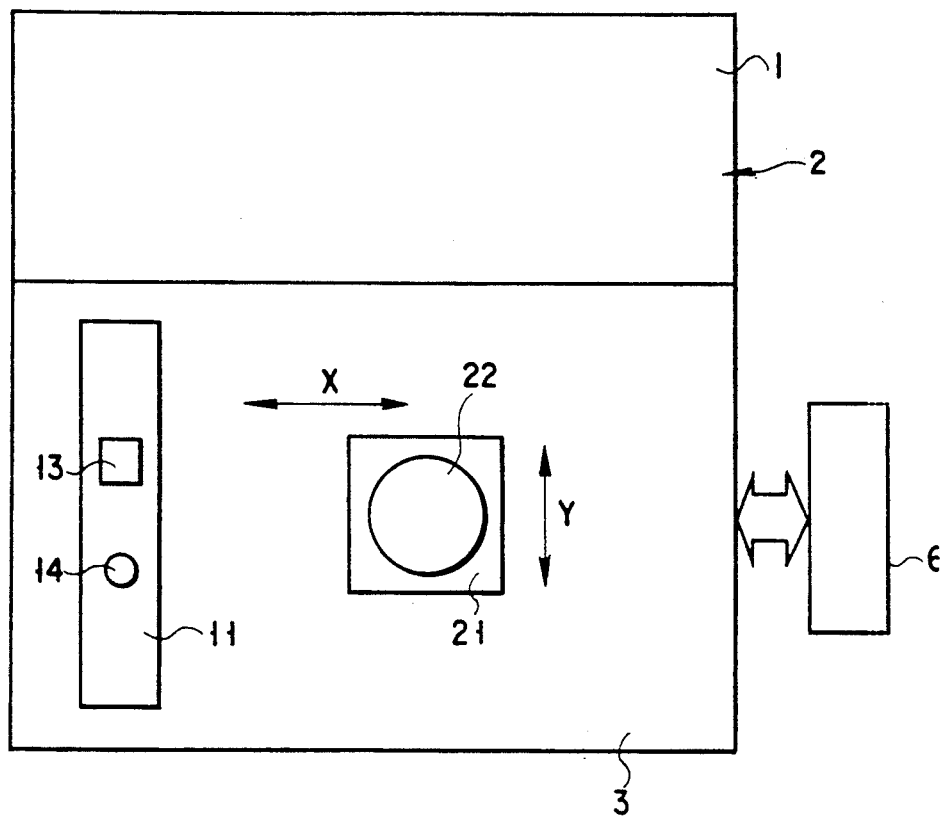
FIG. 2 is a schematic plan view showing the layout of the probe apparatus shown in FIG. 1.

FIG. 1 is a perspective view showing an important part of a probe apparatus for a semiconductor wafer according to an embodiment of the present invention. FIG. 2 is a schematic plan view showing the layout of the probe apparatus.

As shown in FIG. 2, the probe apparatus has a convey unit 2 and an examination unit 3 formed by dividing a body casing 1. A pre-alignment stage a handling arm, etc. are arranged in the convey unit 2. A wafer or an object to be examined is pre-aligned on the convey unit 2 and transferred to the examination unit 3. The examination unit 3 is provided with an examination mechanism, as shown in FIG. 1, for examining the electrical characteristics of IC chips formed on the surface of the wafer. The outline of the entire structure and function of this type of probe apparatus is disclosed in U.S. application Ser. No. 07/726,725, the teachings of which are hereby incorporated by reference.

In FIG. 1, reference numeral 11 denotes an alignment bridge, 12 a probe card, 13 a stationary camera, 14 a capacitance sensor, 21 a stage, 22 a chuck, 23 a movable camera, and 24 an elevating mechanism for the movable camera 23. In this embodiment, the fixed-focus stationary camera 13 is used as first optical position detecting means, and the fixed-focus movable camera 23 as second optical position detecting means. Symbols X, Y and Z indicate axes of a coordinate system shown for the purpose of description, and axes X, Y and Z are perpendicular to one another.

The probe apparatus contains conventional mechanisms such as a driving mechanism for driving the stage 21 and chuck 22, a processor 6 for controlling this driving mechanism, cameras, prober, etc. and processing data delivered from these devices.

The alignment bridge 11 is fixed to the body casing 1. The alignment bridge 11 is provided with the stationary camera 13 for detecting the position of the chip on the semiconductor wafer and the capacitance sensor 14 for detecting the height of the wafer surface, etc.

An opening is formed at a center of the probe card 12. A number of probe needles 12a are projected slantingly downward from the peripheral edge of this opening. The probe needles 12a are arranged so as to come into contact with the electrode pads of an IC chip.

Figure 3:
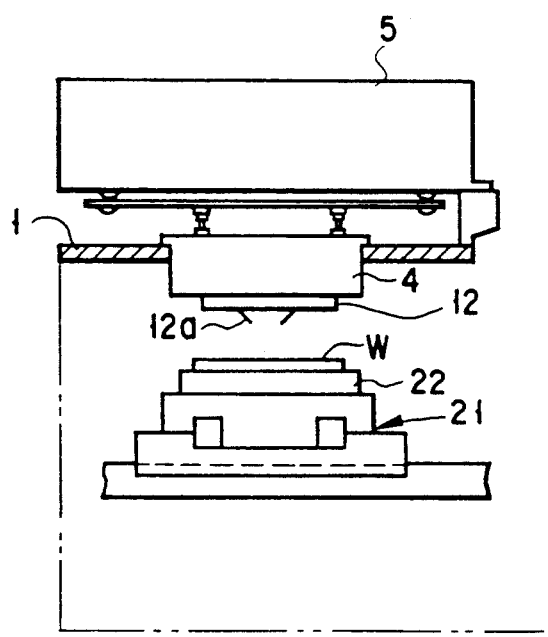
FIG. 3 is a schematic side view showing the relationship between a probe card and a chuck.

As shown in FIG. 3, the probe card 12 is attached to an insert ring 4 provided above the stage 21. On the other hand, the insert ring 4 is fixed to the body casing 1. A test head 5 is retractably provided above the insert ring 4. The test head 5 is electrically connected to the probe card 12 via the ring 4. In the state wherein the probe needles 12a are put in contact with the electrode pads of the IC chip, the test head 5 outputs predetermined electric signals to the IC chip via the probe needles 12a and receives return signals from the chip, thereby checking the electrical characteristics of the IC chip.

Referring back to FIG. 1, the stage 21 comprises an X-stage 21a movable in the X-direction along two rails extending in the X-direction, and a Y-stage 21b movable in the Y-direction along two rails extending in the Y-direction over the X-stage 21a. The X- and Y-stages 21a and 21b are driven in the X- and Y-directions in a horizontal plane by a conventional driving mechanism including a pulse motor, etc. The chuck 22 mounted on the Y-stage 21b is driven vertically (in the Z-direction) by a conventional elevating mechanism. In addition, the chuck 22 is rotated about its own center axis (i.e. parallel to the Z-axis) by a conventional rotating mechanism.

An elevating mechanism 24 is fixed to a side surface of the Y-stage 21b. The vertical movable camera 23 is held to the elevating mechanism 24. The movable camera 23 comprises a high-magnification portion 23a and a low-magnification portion 23b. A light-emitting element 23c, such as an LED, is provided adjacent to the high-magnification portion 23a. The light-emitting element 23c is used for lighting up the probe needles 12a when the needles 12a are observed, so that the position of the needles is easily identified. The quantity of light of the element 23c can be varied by a controller.

Figure 4:
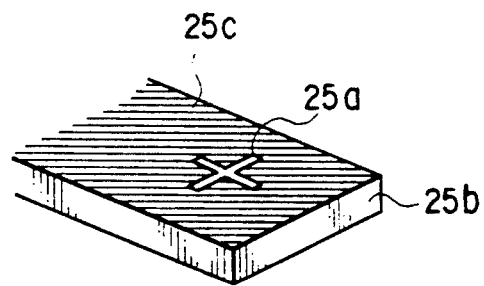
FIG. 4 is a perspective view showing an example of the structure of a target.

A projection 25 is fixed to the side surface of the chuck 22. The projection 25 projects horizontally in the radial direction of the chuck 22. As shown in FIG. 4 (enlarged perspective view), the projection 25 is formed of a strip-like transparent plate 25b. A target 25a is formed on the surface of the plate 25b. The target 25a is defined by the center of a cruciform mark described by using an electrically conductive thin film, e.g. an ITO (indium tin oxide) thin film or chromium. The target 25a serves as a reference point for detection by use of the cameras 13 and 23. An electrically conductive transparent thin film, e.g. ITO thin film 25c, is provided in the vicinity of the cruciform thin film 25a. In this embodiment, the surfaces of thin film of the target 25a and electrically conductive transparent thin film 25c are on a level with each other. The transparent thin film 25c enables the capacitance sensor 14 to effect the Z-position detection.

The projection 25, on which the target 25a is formed, is moved to, and retreated from, the optical axis of the high-magnification portion of the movable camera 23 by the rotation of the chuck 22. The projection 25 may be detachably attached to the chuck 22.

Figure 9:
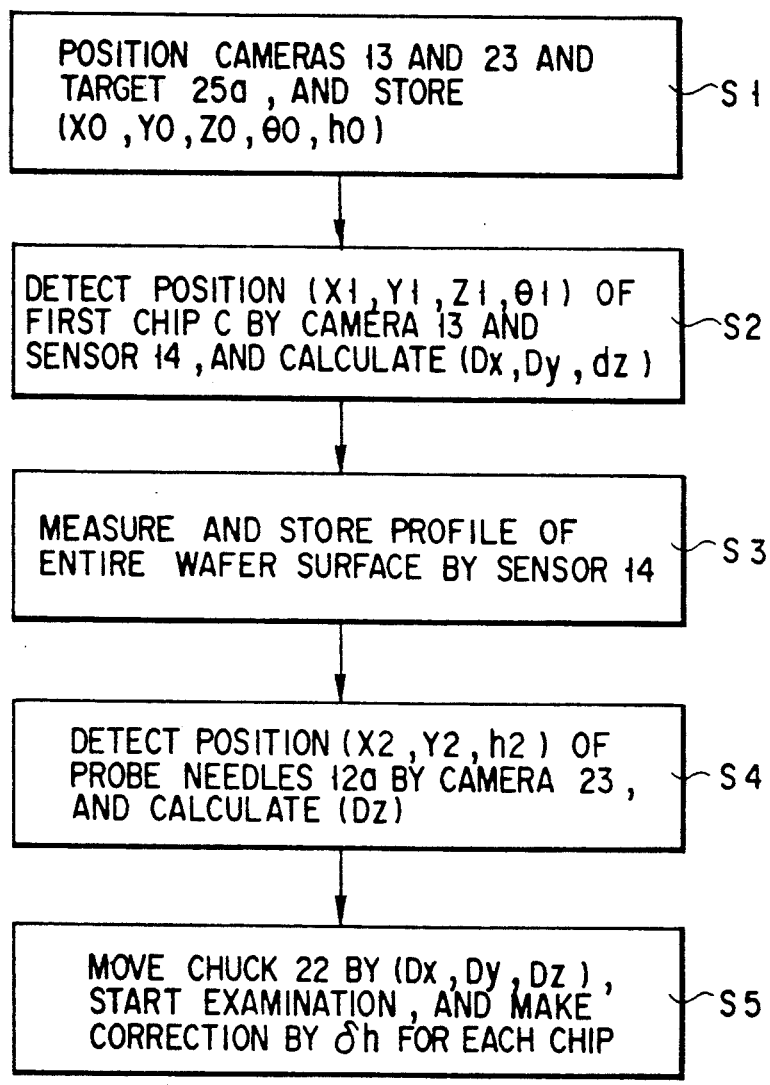
FIG. 9 is a flow chart showing the operations for alignment between the chip of the wafer and the probe needles.

The alignment operation of the probe apparatus for aligning the IC chip on the wafer and the probe needles will now be described with reference to the flow chart of FIG. 9. Prior to alignment, the chuck 22 is moved to a predetermined position by the driving mechanism of the stage 21, and a semiconductor wafer is transferred from the convey unit 2 onto the chuck 22.

In first step S1, positioning between the stationary camera 13, movable camera 23 and target 25a is performed. At this time, the height of the target 25a is measured by the capacitance sensor 14. Data (X0, Y0, Z0, θ0, h0) mentioned below is stored. The details of step 1 are as follows.

The chuck 22, on which the wafer W has been mounted, is moved to a position below the stationary camera 13 of the alignment bridge 11 by the driving mechanism of the stage 21. In this case, the chuck 22 is rotated and the target 25a is positioned near the center of the visual field of the high magnification portion 23a of the movable camera 23.

Figure 5:
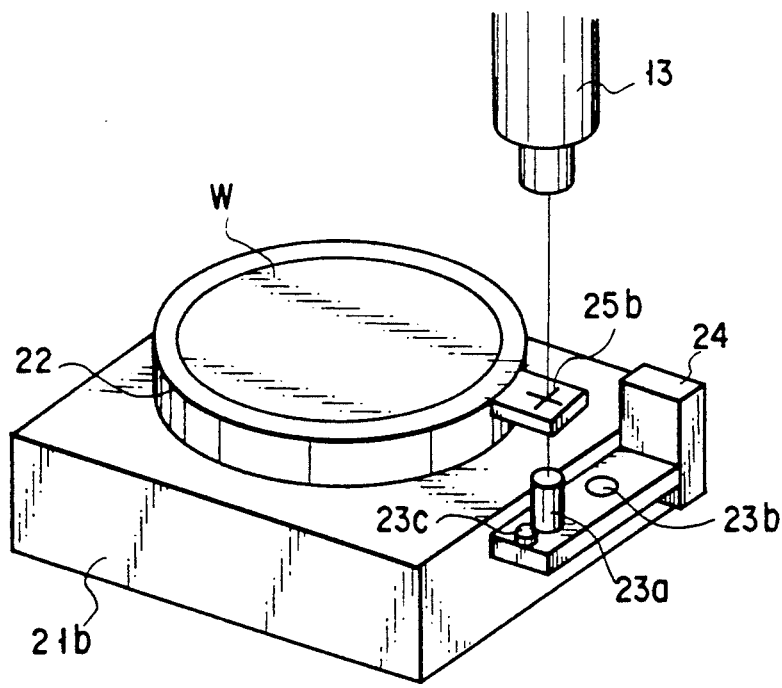
FIG. 5 is a perspective view showing the alignment state of the visual fields of a stationary camera and a movable camera.
Figure 6:
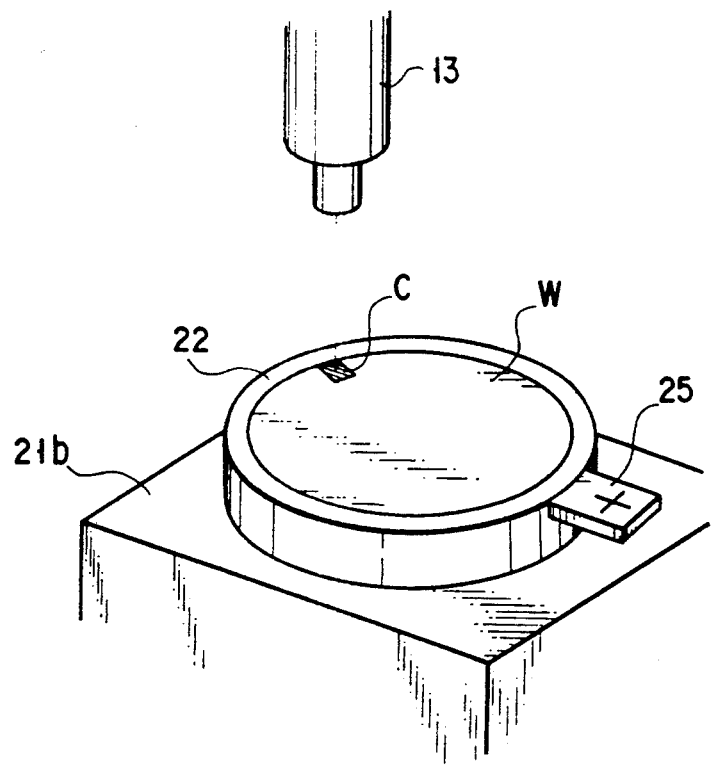
FIG. 6 is a perspective view showing the state in which the position of a chip on a semiconductor wafer is detected by using the stationary camera.

Then, as shown in FIG. 5, the stage 21 is positioned in the XY-coordinates so that the target 25a coincides with the center of the visual field of the stationary camera 13. In the positioning step, the height of the chuck 22 is adjusted until the clearness of the image of the target 25a takes a maximum value, and thereby the target 25a is positioned at the focus of the stationary camera 13. Subsequently, the height of the movable camera 23 is adjusted by the elevating mechanism 24 until the clearness of the image of the target 25a takes a maximum value, and thereby the movable camera 23 is positioned such that the target 25a is at the focus of the lens. In the state wherein the positioning has been completed, the centers of visual fields and focal points of the stationary camera 13 and the high-magnification portion 23a of the movable camera 23 agree with each other, with the target 25a interposed therebetween.

In this state, the rotational coordinate position (θ0) of the chuck 22 and the XY-coordinates position (X0, Y0) of the stage 21 are stored as data in the processor. In addition, the height position (h0) of the movable camera 23 moved by the elevating mechanism 24 is stored as data in the processor.

Then, the chuck 22 is moved by the stage 21 in the XY-coordinates so that the target 25a or electrically conductive thin film 25c comes just below the capacitance sensor 14. The height position (Z0) of the target 25a is measured by the capacitance sensor 14 and stored as data in the processor.

In second step S2, the first chip C on the wafer W to be examined is positioned at the stationary camera 13, and the chip C is detected. The height position of the chip C is also measured by the capacitance sensor 14. The data (X1, Y1, Z1) mentioned below is input to the processor, and data (Dx, Dy, dz) calculated on the basis of this data is stored. In addition, data (θ1) detected separately is stored. The details of step S2 are as follows.

The stage 21 is moved in the XY-coordinate, and the image of the chip C on the wafer W to be first examined is input to the stationary camera 13. The stage 21 is positioned in the XY-coordinate so as to position a specific portion of the input image of the chip C at the center of the visual field of the stationary camera 13.

The rotational coordinate position of the chuck 22 is adjusted in accordance with the arrangement of the electrode pads of the chip C or scribe lines of the chips on the wafer W. The outline of the positioning of the chuck 22 in the rotational coordinate is disclosed in U.S. Pat. No. 4,966,520, the teachings of which are hereby incorporated by reference.

In the state wherein the positioning has been completed, data relating to the position (X1, Y1) of the stage 21 and the position or rotational angle (θ1) of the chuck 22 is input to the processor. Then, the chip C is moved to a position under the capacitance sensor 14, and data on the height position (Z1) of the chip C is obtained and input to the processor.

Figure 10:
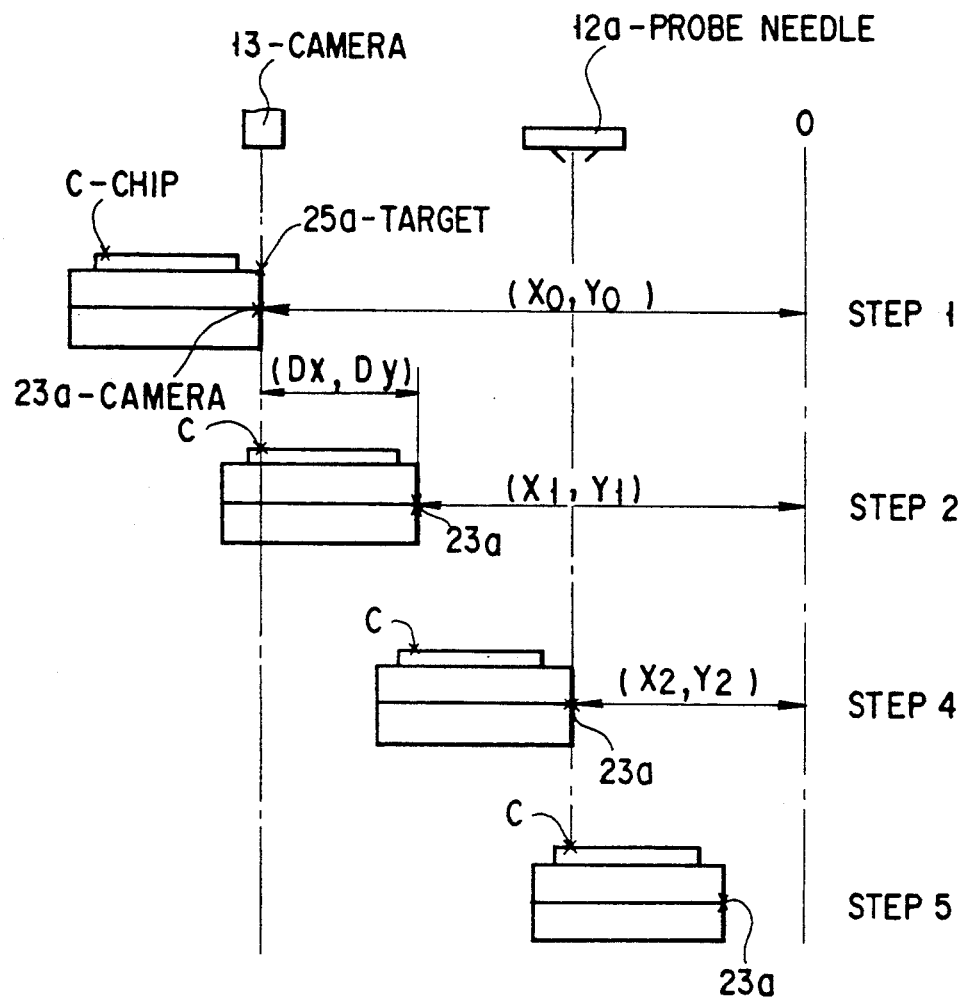
FIG. 10 is a view for explaining the horizontal positioning in the alignment operation.
Figure 11:
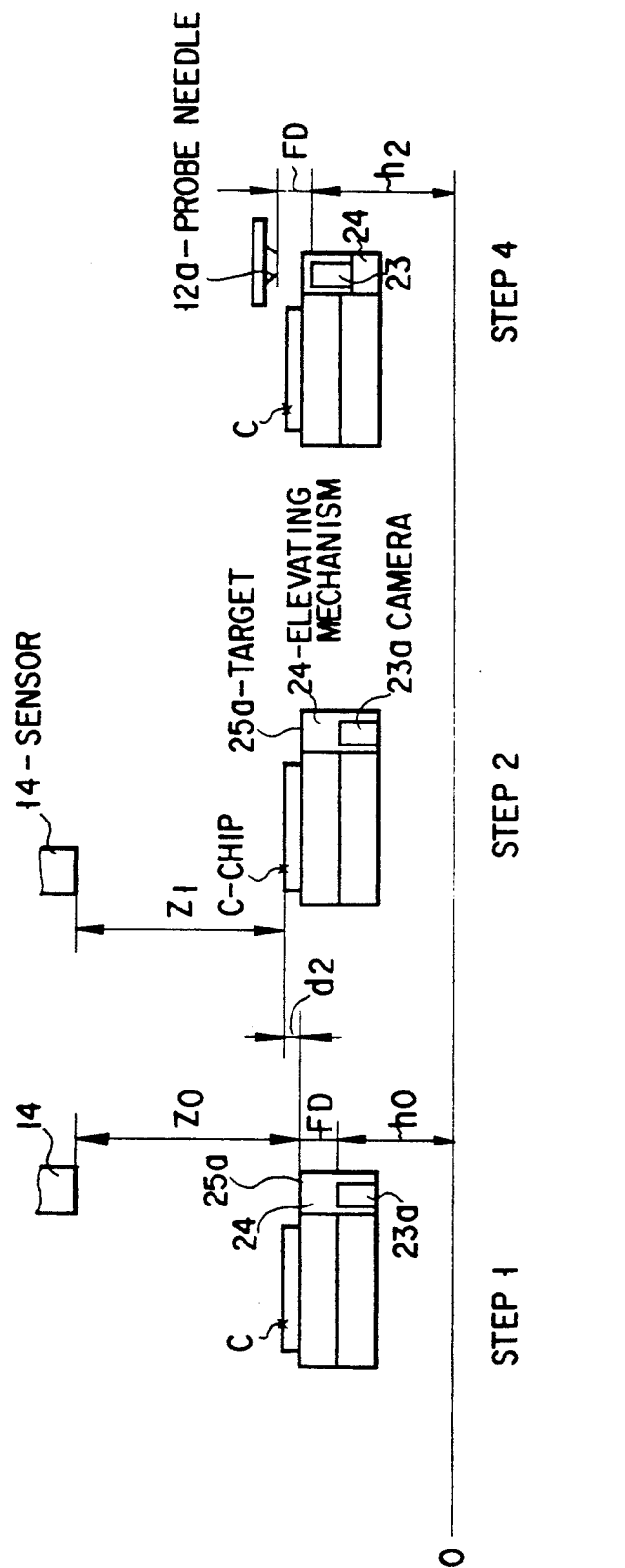
FIG. 11 is a view for explaining the vertical positioning in the alignment operation.

In the processor, Dx=abs (X1—X0) and Dy=abs (Y1—Y0) relating to the horizontal distance is calculated and stored (where "abs" indicates an absolute value). As shown in FIG. 10, Dx and Dy are regarded as (X, Y) components of the horizontal distance between the first chip C and the high-magnification portion 23a of the movable camera 23. In addition, in the processor, regarding the vertical distance, dz=abs (Z1—Z0) is calculated. As shown in FIG. 11, (Z1—Z0) is a vertical distance between the target 25a and the chip C on the wafer surface. In FIG. 1, FD indicates a focal distance.

In third step S3, the height distribution or profile of the wafer W is measured by the capacitance sensor 14, and the profile is stored as data. The reason for this is that the height of chips on the wafer W is not uniform owing to a variation in thickness of the wafer W or a warp of the wafer W. The details of step S3 are as follows.

Figure 8A:
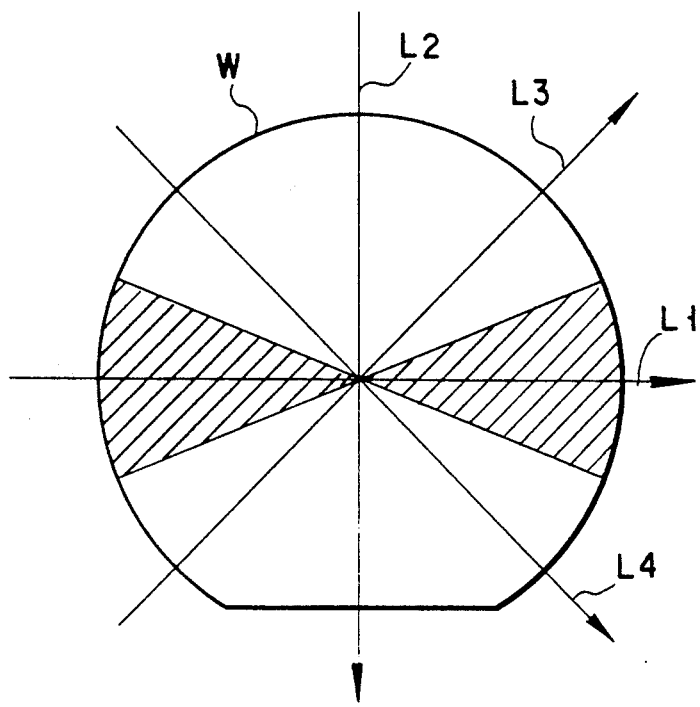
FIG. 8A and FIG. 8B are views for explaining a method of detecting the vertical profile of the surface of the semiconductor by use of a capacitance sensor.
Figure 8B:
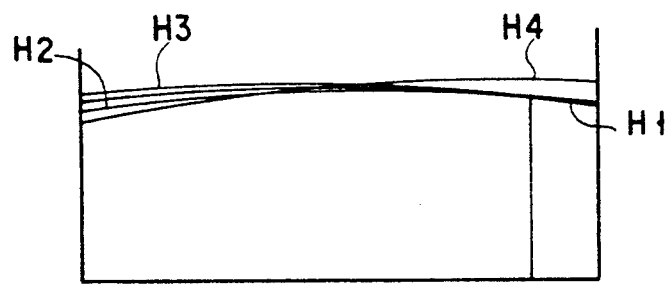

The chuck 22 holding the wafer W is moved to a position just below the capacitance sensor 14 by the stage 21. As shown in straight lines L1 to L4 in FIG. 8A, the surface of the wafer W is scanned in the mutually perpendicular directions and slanting (45°) directions. The height profile of the wafer surface is measured, as indicated by lines H1 to H4 in FIG. 8B, and stored as data in the processor. The surface of the wafer W is divided into four pairs of sectors having scan lines L1 to L4 as their center lines and apical angles of 45°. For example, a pair of sectors including scan line L1 are indicated by hatched lines. When the electrical characteristics are measured later, the heights of the respective chips included in each sector is utilized as a difference δh in height between chip C and other chips.

In the fourth step S4, the position of tip portions of the probe needles 12a is detected by the high-magnification portion 23a of the movable camera 23, and data (X2, Y2, h2), mentioned below, is stored. In addition, data (Dz) calculated based on (h2) mentioned below is stored. The details of step 4 are as follows.

Figure 7:
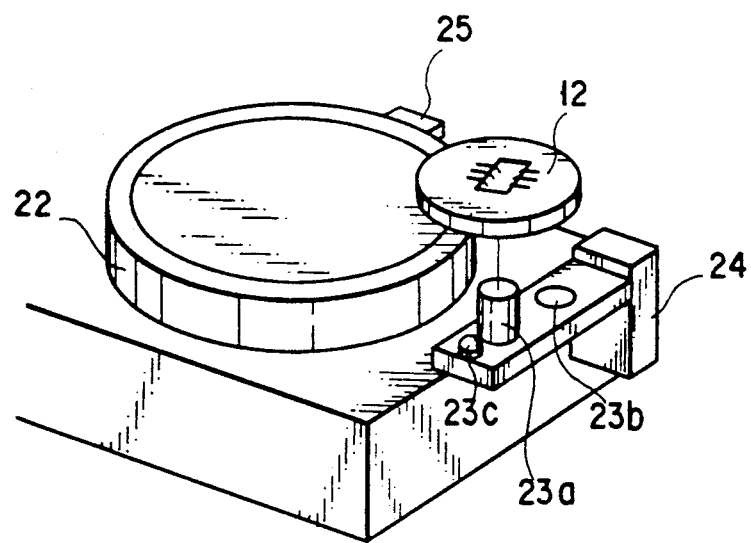
FIG. 7 is a perspective view showing the state in which the position of the probe needles is detected by the movable camera.

As is shown in FIG. 7, the chuck 22 is rotated, and the target 25a is retreated out of the visual field of the movable camera 23. Then, the chuck 22 is moved by the stage 21 to a position below the probe card 12, and the image of the probe card 12 is input to the movable camera 23. The stage 21 is positioned in the XY-coordinate so as to position the image of the tip portion of a specific probe needle 12a, included in the image of the probe card 12, at the center of the visual field of the movable camera 13.

In this positioning step, rough positioning is first effected by the low-magnification portion 23b of the movable camera 23, and then precise positioning is effected by the high-magnification portion 23a. While positioning in the XY-coordinate is being performed, the height of the movable camera 23 is adjusted by the elevating mechanism 24 until the clearness of the image of the tip portion of the specific probe needle 12a takes a maximum value. Thus, the tip portion of the specific probe needle is positioned at the focus of the movable camera 23.

After the positioning is completed, the rotational coordinate position of the chuck 25 is restored to θ1. In this state, data on the position (X2, Y2) of the stage 21 and the height (h2) of the movable camera 23 elevated by the elevating mechanism 24 is stored in the processor.

In the processor, regarding the vertical distance, $Dz = abs(h2 - h0) - dz$ is calculated. As shown in FIG. 11, $(h2 - h0)$ is the vertical distance (height) between the target 25a and the tip portion of the specific probe needle 12a detected by the movable camera 23. As has been stated above, dz is the vertical distance between the target 25a and the chip C on the wafer surface. Accordingly, Dz is the vertical distance between the chip C and the tip portion of the specific probe needle 12a.

Finally, in fifth step S5, the electrical characteristics of the chip are examined.

In the XY-coordinate, i.e. horizontal plane, the chuck 22 is moved by the stage 21 by (Dx, Dy) from the position (X2, Y2) at the time of completion of step S4. More specifically, as shown in FIG. 10, the chuck 22 is moved by the distance between the chip C and the movable camera 23, from the position where the movable camera 23 is aligned with the probe needle 12a.

In addition, the chuck 22 is raised in the Z-direction (i.e. vertically) by $Dz + \alpha$ ($\alpha > 0$) from the position at the time of completion of step S4.

After the horizontal and vertical movement of the chuck 22 is completed, a specific portion (a specific electrode pad in this embodiment) of the chip C is brought into contact with the tip portion of the specific probe needle 12a of the probe card 12 with a suitable contact pressure resulting from $+\alpha$. Simultaneously, the other pads of the chip C are brought into contact with the corresponding tip portions of the probe needles 12a of the probe card 12 with a suitable contact pressure. Subsequently, examination of the electrical characteristics is started by the examination or probe apparatus.

After the automatic alignment of the first chip C and the examination of electrical characteristics is completed, examination of electrical characteristics of the other chips to be examined is successively performed. In this case, the chuck 22 is moved horizontally by a distance corresponding to the distance between chips and vertically by a distance between a contact height and a contact release height which is lower than the contact height by a predetermined degree. At this time, the correction value δh for elevation height is added in order to make uniform the contact pressure between each chip and the prove needles, in the presence of a variation in thickness of the wafer and a variation in height of each chip due to a warp of the wafer.

When the examination of all chips of the first wafer is completed in this manner, the chuck 22 is moved to the vicinity of the convey unit 2 and the examined wafer is replaced by a new wafer to be examined.

The process for the alignment between the probe needles and the chips of the new wafer can be initiated from the step S2, with the step S1 omitted. However, the precision of alignment lowers if the data (X0, Y0, Z0, θ0, h0) varies due to thermal expansion of the chuck 22. Accordingly, it is desirable to position the visual fields of the cameras 13 and 23 in the step S1 and update data for some of the wafers to be examined (most desirably, for each wafer).

In the above embodiment, the stationary camera 13 is used to detect the position of the chip which is to be first examined. However, such a real chip may be replaced with a dummy chip formed at a predetermined position on the wafer. The dummy chip has a specific pattern suitable for position detection. Specifically, the position of the dummy chip is detected by using the stationary camera 13, and the position of the chip to be first examined is calculated on the basis of the detection result and the positional relationship between the dummy chip and the other chips on the wafer.

In the above embodiment, the fixed-focus cameras 13 and 23 are used. However, it is possible to detect the position of an object to be observed by using an automatic focusing mechanism. In this case, a member for measuring a length to a focal point is provided in a camera.

The probe apparatus of the present invention is applicable not only to semiconductor wafers but also to other objects such as liquid crystal substrates.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A probe apparatus for testing electrical characteristics of each of a plurality of chips arranged on a substrate to be examined, said probe apparatus comprising:
   a probe card having a plurality of probe needles for contact with one of the chips on the substrate;
   signal exchange means for exchanging electric signals between the signal exchange means and one of the chips via the probe needles;
   a chuck, arranged to face the probe card, for supporting the substrate;
   a support member for supporting the chuck, the support member being movable in horizontal X-Y coordinates along with the chuck;
   first detection means for optically detecting a position of the chips, the first detection means being arranged within a range where the chuck can be moved horizontally and to face each of the chips;
   second detection means for optically detecting a position of the probe needles, the second detection means being supported by and movable in the X-Y coordinates along with the support member, and arranged to face one of the probe needles;
   a capacitance sensor for detecting vertical positions of the chips;
   a transparent plate removable disposed between the first and second detection means;
   a target formed on the transparent plate, the target being used for horizontally aligning the first and second detection means;
   a first thin film electrically conductive and transparent, and formed on the transparent plate, a major surface of the first thin film, which surface is on the capacitance sensor side, being used for calculating a vertical distance between a specific portion of each of the chips and a specific portion of the probe needles; and
   a processor for controlling operations of the first and second detection means, the capacitance sensor, the chuck and the support member, and for calculating a relative position of said specific portion of each of the chips in relation to said specific portion of the probe needles.

2. The apparatus according to claim 1 wherein said target is formed of an electrically conductive, and transparent second thin film.

3. The apparatus according to claim 2, wherein the surfaces of said first and second thin films are substantially on a level with each other.

4. The apparatus according to claim 3, wherein said second thin film is formed of indium tin oxide or chromium.

5. The apparatus according to claim 4, wherein said first thin film is formed of indium tin oxide.

6. The apparatus according to claim 1, wherein said first detection means comprises a first fixed-focus camera facing vertically downward and relatively fixed in relation to the probe card.

7. The apparatus according to claim 1, wherein said second detection means comprises a second fixed-focus camera which faces vertically upward and is supported by said support member while being allowed to move vertically.

8. The apparatus according to claim 1, wherein the chuck is vertically movable relative to the probe card.

9. The apparatus according to claim 8, wherein the chuck is supported by and vertically movable relative to the support member.

10. The apparatus according to claim 7, further comprising a light emitting element supported by the support member for lighting up the probe needles.

11. The apparatus according to claim 1, wherein the chuck is supported by the support member while allowed to be rotatable in a horizontal plane, and wherein the transparent plate is supported by the chuck, movable along with the second detection means by the support member, and removably disposed above the second detection means by rotation of the chuck.

12. An alignment method for a probe apparatus for testing electrical characteristics of each of a plurality of chips arranged on a substrate to be examined, said probe apparatus comprising:
a probe card having a plurality of probe needles for contact with one of the chips on the substrate;
signal exchange means for exchanging electric signals between the signal exchange means and one of the chips via the probe needles;
a chuck, arranged to face the probe card, for supporting the substrate;
a support member for supporting the chuck, the support member being movable in horizontal X-Y coordinates along with the chuck;
first detection means for optically detecting a position of the chips, the first detection means being arranged within a range where the chuck can be moved horizontally and to face each of the chips;
second detection means for optically detecting a position of the probe needles, the second detection means being supported by and movable in the X-Y coordinates along with the support member, and arranged to face one of the probe needles;
a capacitance sensor for detecting vertical positions of the chips;
a transparent plate removable disposed between the first and second detection means;
a target formed on the transparent plate, the target being used for horizontally aligning the first and second detection means;
a first thin film electrically conductive and transparent, and formed on the transparent plate, a major surface of the first thin film, which surface is on the capacitance sensor side, being used for calculating a vertical distance between a specific portion of each of the chips and a specific portion of the probe needles; and
a processor for controlling operations of the first and second detection means, the capacitance sensor, the chuck and the support member, and for calculating a relative position of said specific portion of each of the chips in relation to said specific portion of the probe needles, said method comprising, in a process of horizontal positioning between the chips and the probe needles, the steps of:
horizontally aligning and bringing into focus the first and second detection means by using the target and the major surface of the first thin film, and regarding a horizontal position of the support member in the X-Y coordinates at this time as a reference horizontal position (X0, Y0);
making a specific portion of one of the chips, which is to be first examined, face the first detection means by horizontally moving the support member, and regarding a horizontal position of the support member in the X-Y coordinates at this time as a first horizontal position (X1, Y1);
making the second detection means face a specific portion of the probe needles, which corresponds to said specific portion of the chip to be first examined, by horizontally moving the support member and regarding a horizontal position of the support member in the X-Y coordinates at this time as a second horizontal position (X2, Y2); and
horizontally moving the support member from the second horizontal position towards the probe needles by Dx=abs (X1−X0), Dy=abs (Y1−Y0), which are calculated on the basis of the reference and first horizontal positions, said method comprising, in a process of vertical positioning between the chips and the probe needles, the steps of:
bringing into focus the second detection means by using the major surface of the first thin film, and regarding a vertical distance of the major surface of the first thin film from a reference horizontal plane at this time as a first vertical distance (h0+FD);
maintaining vertical positions of the major surface of the first thin film and the chuck in the state wherein the first vertical distance is obtained, detecting a vertical distance of the major surface of the first thin film from the capacitance sensor by using the capacitance sensor, and regarding this detected vertical distance of the major surface of the first thin film as a second vertical distance (Z0);
maintaining the vertical position of the chuck in the state wherein the first vertical distance is obtained, detecting a vertical distance of said specific portion of the chip to be first examined from the capacitance sensor by using the capacitance sensor, and regarding this detected vertical distance of said specific portion as a chip vertical distance (Z1);
maintaining the vertical position of the chuck in the state wherein the first vertical distance is obtained, detecting a vertical distance of said specific portion of the probe needles from the reference horizontal plane by using the second detecting means, and regarding this detected vertical distance of said specific portion of the probe needles as a needle vertical distance (h2+FD); and vertically moving the probe needles and the chuck relative to each other, from the state wherein the first vertical distance is obtained, by (h2−h0)−abs (Z1−Z0)+α (wherein α is a positive value obtained from an optimal contact pressure of the probe needles on the chip to be first examined), which is calculated on the basis of the first, second, chip, and needle vertical distances.

13. The method according to claim 12, wherein the relative vertical movement between the probe needles and the chuck is performed by moving only the chuck.

14. The method according to claim 12, wherein the chuck is supported by the support member while allowed to be rotatable in a horizontal plane, and wherein the transparent plate is supported by the chuck, movable along with the second detection means by the support member, and removably disposed above the second detection means by rotation of the chuck.

15. The method according to claim 12, further comprising the step of detecting a height of the chips on the substrate by the capacitance sensor, wherein a difference (δh) in height between the chip to be first examined and each of the other chips is used as a correction value for examining the respective chips.

16. The method according to claim 12, wherein said (X0, Y0) and (h0+FD) are detected in the same step.

17. The method according to claim 12, wherein said (X2, Y2) and (h2+FD) are detected in the same step.

18. The method according to claim 15, wherein said (Z1) and the height of the chips on the substrate are detected in consecutive steps.

19. The method according to claim 12, wherein said target is formed of an electrically conductive, transparent second thin film.

20. The method according to claim 19, wherein the surfaces of said first and second thin films are substantially on a level with each other.

21. The method according to claim 20, wherein said second thin film is formed of indium tin oxide or chromium.

22. The method according to claim 21, wherein said first thin film is formed of indium tin oxide.

23. The method according to claim 12, wherein said first detection means comprises a first fixed-focus camera facing vertically downward and relatively fixed in relation to the probe card.

24. The method according to claim 12, wherein said second detection means comprises a second fixed-focus camera which faces vertically upward and is supported by said support member while being allowed to move vertically.

25. The method according to claim 24, further comprising the step of lighting up the probe needles by using a light emitting element when the needle vertical distance is detected.

* * * * *